United States Patent
Narushima

(10) Patent No.: US 12,463,041 B2
(45) Date of Patent: Nov. 4, 2025

(54) METHOD AND APPARATUS FOR FORMING RUTHENIUM SILICIDE FILM ON SURFACE OF SUBSTRATE

(71) Applicant: Tokyo Electron Limited, Tokyo (JP)

(72) Inventor: Kensaku Narushima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 432 days.

(21) Appl. No.: 18/157,910

(22) Filed: Jan. 23, 2023

(65) Prior Publication Data
US 2023/0245893 A1 Aug. 3, 2023

(30) Foreign Application Priority Data
Feb. 3, 2022 (JP) ................. 2022-015750

(51) Int. Cl.
| | |
|---|---|
| H01L 21/28 | (2025.01) |
| C23C 16/16 | (2006.01) |
| C23C 16/18 | (2006.01) |
| C23C 16/56 | (2006.01) |
| H01L 21/285 | (2006.01) |
| H01L 23/532 | (2006.01) |
| H10D 62/83 | (2025.01) |
| H10D 64/01 | (2025.01) |
| H10D 64/62 | (2025.01) |
| H01L 23/522 | (2006.01) |

(52) U.S. Cl.
CPC ........ H01L 21/28518 (2013.01); C23C 16/16 (2013.01); C23C 16/18 (2013.01); C23C 16/56 (2013.01); H01L 21/28568 (2013.01); H01L 23/53257 (2013.01); H10D 62/83 (2025.01); H10D 64/01 (2025.01); H10D 64/62 (2025.01); *H01L 23/5226* (2013.01)

(58) Field of Classification Search
CPC ......... C23C 16/16; C23C 16/18; C23C 16/56; H01L 21/28518; H01L 21/28568; H01L 23/5226; H01L 23/53257; H10D 62/83; H10D 64/01; H10D 64/62
USPC ........................................................ 438/655
See application file for complete search history.

(56) References Cited

U.S. PATENT DOCUMENTS

| | | | |
|---|---|---|---|
| 2014/0019716 A1* | 1/2014 | Jezewski | H01L 23/53223 438/643 |
| 2021/0017642 A1* | 1/2021 | Ishizaka | C23C 16/4488 |

FOREIGN PATENT DOCUMENTS

| | | |
|---|---|---|
| JP | H06-295880 A | 10/1994 |
| JP | 2002-524847 A | 8/2002 |
| JP | 2020-105591 A | 7/2020 |

(Continued)

OTHER PUBLICATIONS

Ivanenko et al., "Transport properties of Mn-doped Ru2Si3", Microelectronic Engineering, 2003, vol. 70, pp. 209-214.

*Primary Examiner* — Monica D Harrison
(74) *Attorney, Agent, or Firm* — Armstrong Teasdale LLP

(57) ABSTRACT

A method of forming a ruthenium silicide film on a surface of a substrate includes: forming a ruthenium film to cover a diffusion layer by supplying a gas containing a ruthenium compound to the surface of the substrate where the diffusion layer is exposed; and forming the ruthenium silicide film including $Ru_2Si_3$ by siliciding the ruthenium film by supplying a gas containing a silicon compound to the substrate while heating the substrate to a temperature within a range of 420 degrees C. or higher and lower than 500 degrees C.

20 Claims, 13 Drawing Sheets

(56) References Cited

FOREIGN PATENT DOCUMENTS

JP        2021-015947 A    2/2021
KR   10-2006-0079144 A   7/2006

* cited by examiner

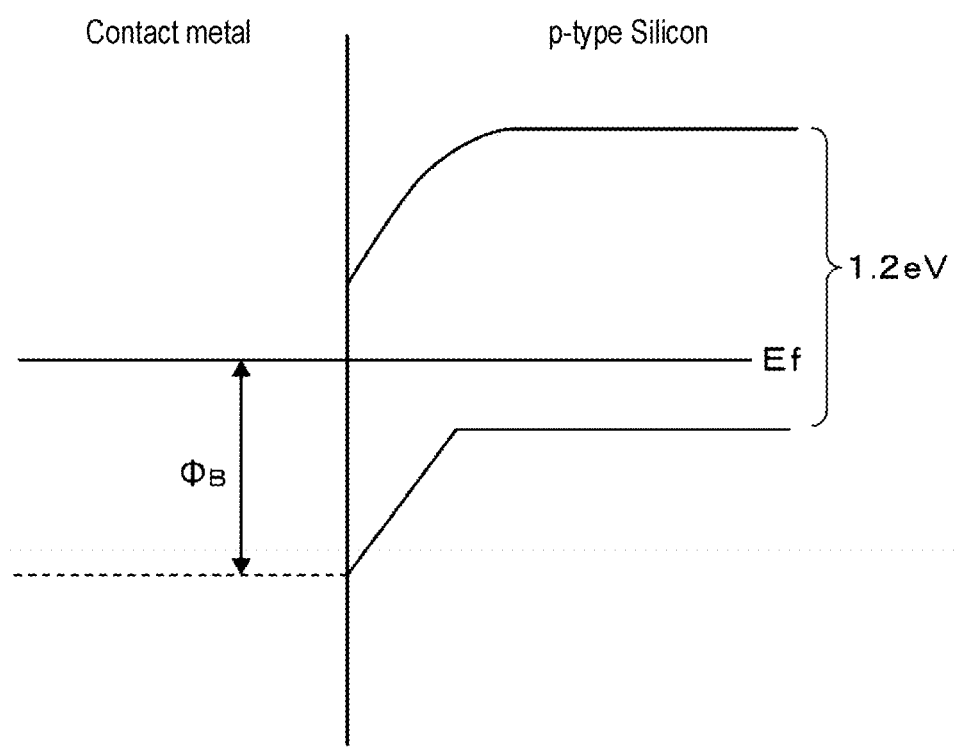

$Ru_3(CO)_{12}$

Example (450°C)

Reference Example (450℃)

METHOD AND APPARATUS FOR FORMING RUTHENIUM SILICIDE FILM ON SURFACE OF SUBSTRATE

CROSS-REFERENCE TO RELATED APPLICATION

This application is based upon and claims the benefit of priority from Japanese Patent Application No. 2022-015750, filed on Feb. 3, 2022, the entire contents of which are incorporated herein by reference.

TECHNICAL FIELD

The present disclosure relates to a method and apparatus for forming a ruthenium silicide film on a surface of a substrate.

BACKGROUND

In a semiconductor device manufacturing process, a process of forming a metal film on a substrate for manufacturing semiconductor devices is performed, in which a ruthenium film (Ru film) may be formed as a metal film. Patent Document 1 discloses a process of forming a RuSi film by supplying a silicon-containing gas to a recess in which a Ru film is formed. In Patent Document 1, the RuSi film is a wiring material and has good step coverage to cover an entire surface of a recess. In addition, Patent Document 2 discloses a process of forming a diffusion barrier layer made of $RuSi_x$ (where x is about 0.01 to 10). In Patent Document 2, the diffusion barrier layer is formed by forming $RuSi_x$ by chemical vapor deposition, or by forming a Ru layer on a silicon region and annealing the Ru layer. Patent Documents 1 and 2 do not describe that the RuSi film or the $RuSi_x$ is $Ru_2Si_3$.

PRIOR ART DOCUMENTS

Patent Documents

Patent Document 1: Japanese Patent Laid-Open Publication No. 2021-15947
Patent Document 2: Japanese Patent Laid-Open Publication No. 2002-524847

SUMMARY

According to one embodiment of the present disclosure, a method of forming a ruthenium silicide film on a surface of a substrate includes: forming a ruthenium film to cover a diffusion layer by supplying a gas containing a ruthenium compound to the surface of the substrate where the diffusion layer is exposed; and forming the ruthenium silicide film including $Ru_2Si_3$ by siliciding the ruthenium film by supplying a gas containing a silicon compound to the substrate while heating the substrate to a temperature within a range of 420 degrees C. or higher and lower than 500 degrees C.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2A is an example of a band structure diagram of a junction between a p-type semiconductor and a metal.

DETAILED DESCRIPTION

Figure 1:
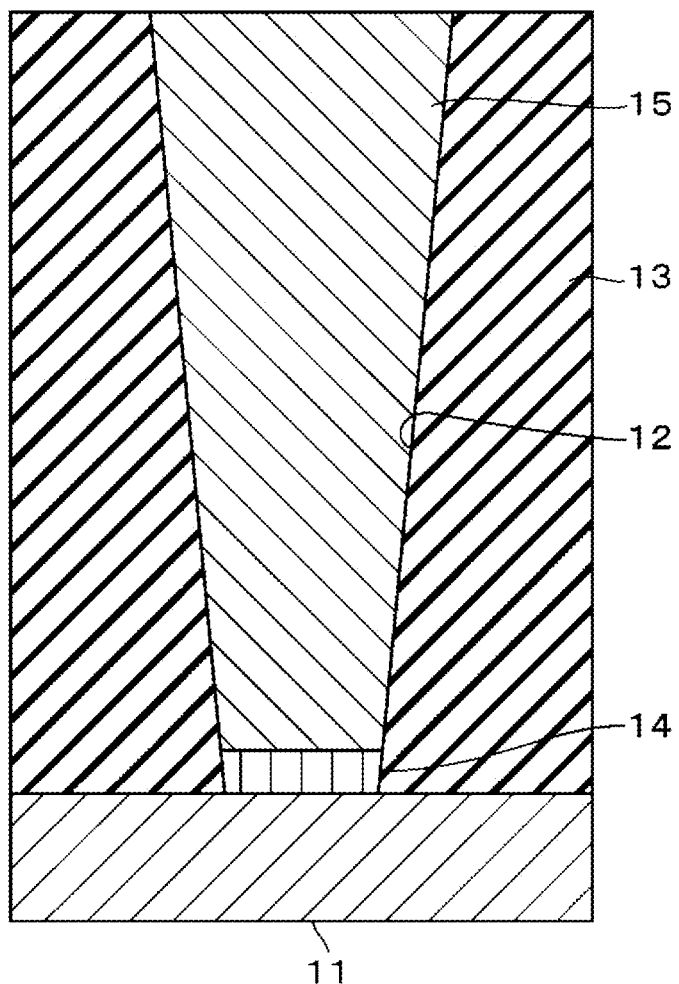
FIG. 1 is a vertical cross-sectional side view illustrating a configuration example of a surface of a silicon substrate.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Surface Structure of Wafer>

In a metal oxide silicon-field effect transistor (MOS-FET) for a logic element, a recess formed in an interlayer insulating film is filled with a metal for wiring for connection with a diffusion layer. With miniaturization of semiconductor devices, there is a demand for lowering a resistance of the metal for wiring, and thus attention is paid to ruthenium (Ru) as a low-resistance material. A surface structure of a substrate in which ruthenium is embedded as a metal for wiring will be described with reference to FIG. 1, by taking a silicon substrate including a p-type diffusion layer as an example. On a silicon substrate 11 in which a p-type diffusion layer is exposed, an insulating film 13 with a recess 12 formed therein is stacked to cover a top surface of the substrate 11. A case where a silicon nitride film (SiN film) or a silicon oxide film (SiO film) is used as the insulating film 13 may be exemplified, but here, a case of adopting a SiN film will be described. The p-type diffusion layer of the silicon substrate 11 is exposed on a bottom surface of the recess 12, a contact layer 14 is formed on the bottom surface of the recess 12, and a ruthenium film (Ru film) is embedded on the contact layer 14 as a wiring layer 15.

The contact layer 14 has a function of establishing electrical conductivity between the substrate 11 and the wiring layer 15, and has conventionally been formed of titanium silicide (TiSi), nickel silicide (NiSi), or the like. However, with the reduction in resistance of the wiring metal, a material having a lower contact resistance may be used for the contact layer as well. Therefore, the inventor is searching for a constituent material of the contact layer 14 which can replace TiSi and NiSi.

During searching for such a low-resistance material, the inventor has paid attention to a band structure at a junction between the contact layer 14 and the p-type silicon substrate 11. FIG. 2A shows, in a case when the contact layer 14 is metal, a band structure at a junction between a contact metal as a metal and a p-type silicon substrate (p-type silicon) as a semiconductor.

In the structure illustrated in FIG. 1, in p-type silicon in which carriers are holes, a Schottky connection with a barrier (Schottky barrier) having a size $\Phi_B$ is formed between the contact metal and the p-type silicon.

Thus, in order to make a current flow from a side of the p-type silicon to a side of the contact metal, it is necessary to apply energy (a potential difference) exceeding a height of the Schottky barrier $\Phi_B$. Therefore, as the contact metal, a material of which the Schottky barrier $\Phi_B$ with the p-type silicon is as small as possible may be selected. Here, the Schottky barrier $\Phi_B$ may be reduced as a work function $\Phi_M$ of the metal constituting the contact metal increases.

Figure 2B:
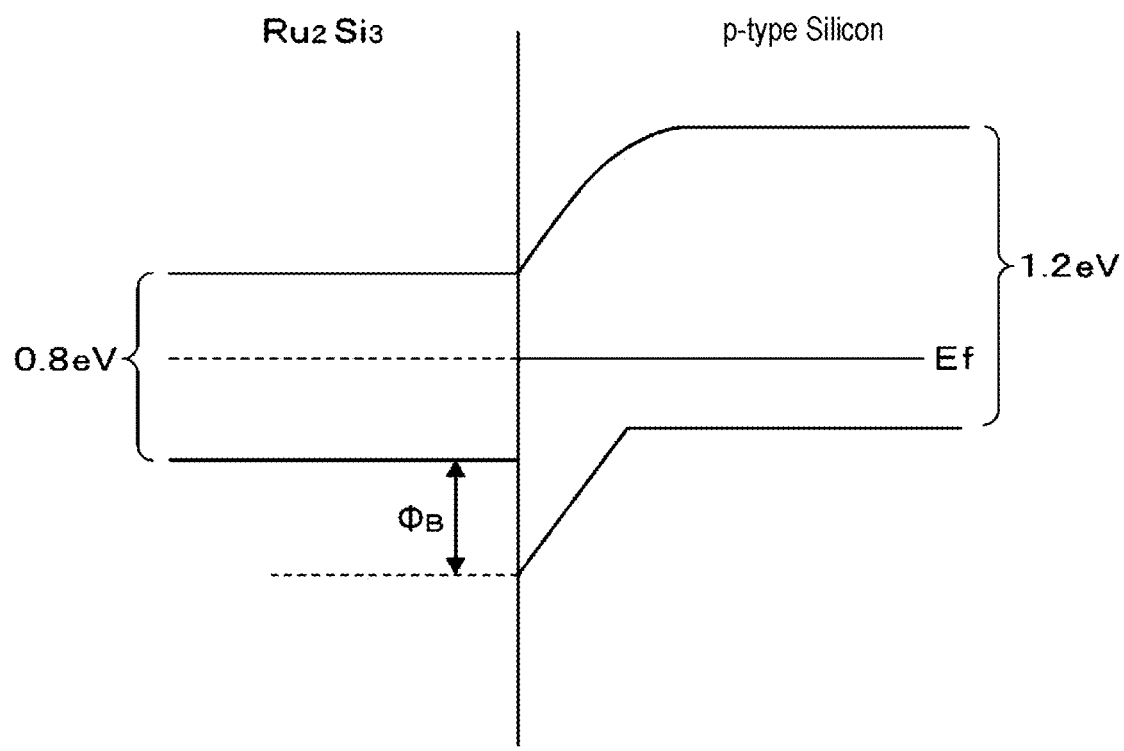
FIG. 2B is an example of a band structure diagram of a junction between a p-type semiconductor and a semiconductor.

As a result of literature research or the like, attention was paid to $Ru_2Si_3$, which is a semiconductor, as a material that has a higher work function $\Phi_M$ than TiSi and is highly likely to reduce the height of the Schottky barrier $\Phi_B$ (see FIG. 2B). Here, $Ru_2Si_3$ is known to have a plurality of types of crystal structures, but the orthorhombic or tetragonal crystal structure has a higher work function $\Phi_M$ than other crystal structures.

However, since $Ru_2Si_3$ is a semiconductor, it is necessary to apply energy so that electrons can be transferred across a band gap. When a sum of a height of the Schottky barrier $\Phi_B$ and a band gap is smaller than the height of the Schottky barrier $\Phi_B$ between TiSi and p-type silicon, the effect of reducing a contact resistance can be obtained compared to conventional ones. $Ru_2Si_3$ satisfies such requirement.

On the other hand, since there is a thermal restriction in manufacturing logic elements, when performing a process involving heating a silicon substrate on which logic elements are formed, it is required to suppress a heating temperature below 500 degrees C. For example, TiSi as described above is formed by forming a titanium film on a silicon substrate and then heating the silicon substrate to thermally diffuse silicon into titanium.

Therefore, when forming $Ru_2Si_3$, it is conceivable to adopt a method of forming a Ru film on a silicon substrate and then thermally diffusing silicon by heating. However, as illustrated in results of evaluation experiments to be described later, it was found that heating at a temperature of 550 degrees C. or higher is required to form $Ru_2Si_3$ using the method described above.

Based on such preliminary examination, the inventor has found a method of forming a ruthenium silicide film containing $Ru_2Si_3$ at a temperature of lower than 500 degrees C.

<Film Forming Apparatus>

Hereinafter, an embodiment of a film forming apparatus constituting an apparatus for forming a ruthenium silicide film on a surface of a substrate will be described below with reference to the drawings. A semiconductor wafer (hereinafter, referred to as a "wafer") W as a substrate is one on which a field effect transistor for a logic element including a p-type diffusion layer is to be formed. Here, a case of forming the wafer W having the surface structure illustrated in FIG. 1 will be described as an example.

Figure 3:
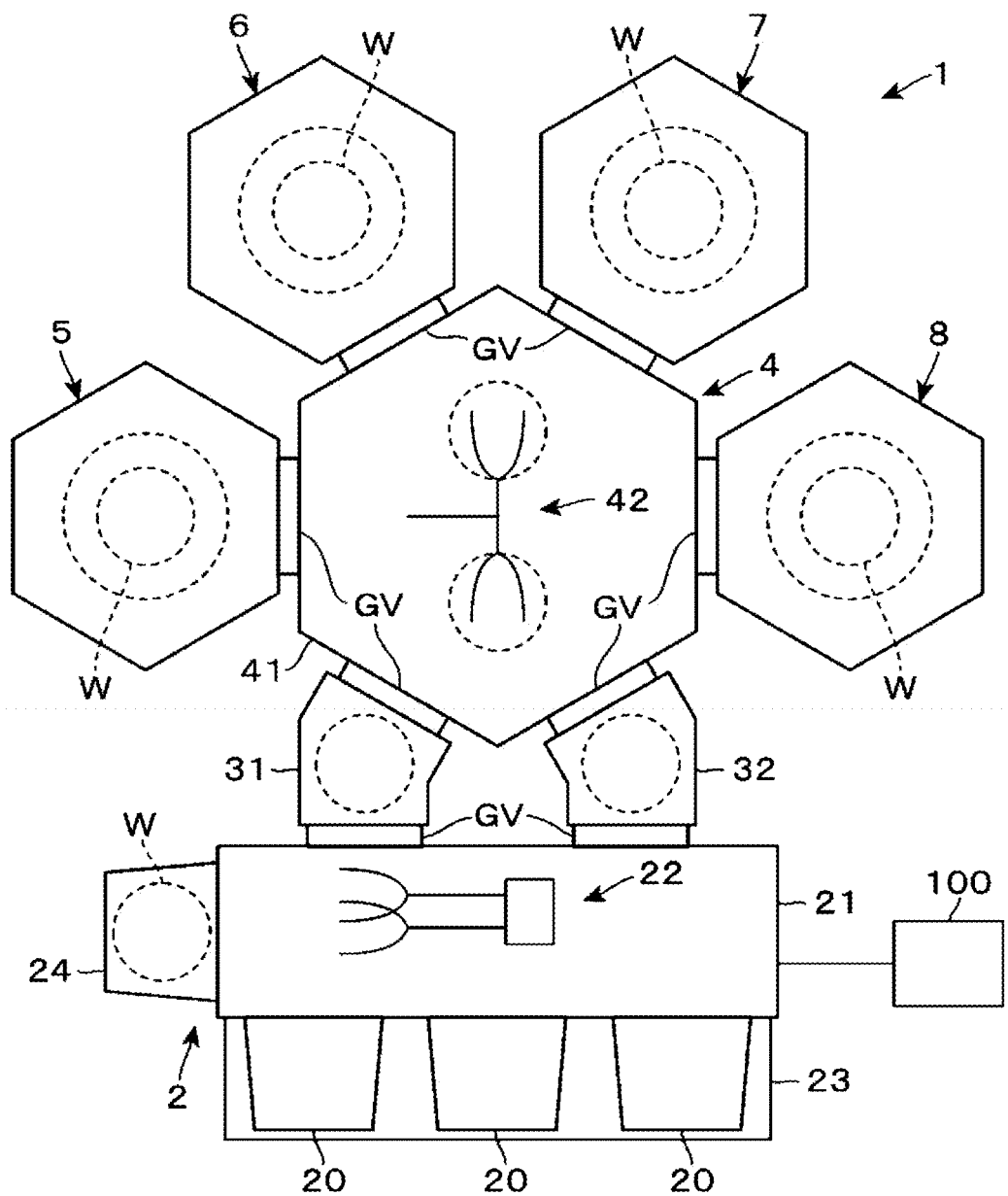
FIG. 3 is a schematic plan view illustrating an apparatus for forming a ruthenium silicide film according to an embodiment of the present disclosure.

FIG. 3 is a schematic plan view illustrating a configuration example of a film forming apparatus 1. The film forming apparatus 1 includes an atmospheric transfer module 2 configured to perform loading and unloading the wafer W, load-lock modules 31 and 32, a vacuum transfer module 4, and a plurality of (e.g., four) processing modules 5, 6, 7, and 8.

The atmospheric transfer module 2 includes an atmospheric transfer mechanism 22 in an atmospheric transfer chamber 21. For example, three carriers 20, each accommodating a plurality of wafers W, and the load-lock modules 31 and 32 are connected to the atmospheric transfer chamber 21, and the atmospheric transfer mechanism 22 is configured to transfer the wafer W. In FIG. 3, reference numeral 23 denotes a carrier stage on which the carriers 20 is mounted, and reference numeral 24 denotes an orienter configured to perform positioning of the wafer W.

The vacuum transfer module 4 is configured by providing a substrate transfer mechanism 42 inside a vacuum transfer chamber 41. The processing modules 5, 6, 7, and 8 and the load-lock modules 31 and 32 are connected to the vacuum transfer chamber 41, and the substrate transfer mechanism 42 transfers the wafer W.

As described above, the two load-lock modules 31 and 32 are connected to the atmospheric transfer chamber 21 and the vacuum transfer chamber 41, and are configured to be capable of switching interiors thereof between an atmospheric pressure atmosphere and a vacuum pressure atmosphere.

Each of the processing modules 5, 6, 7, and 8 includes a processing container connected to the vacuum transfer chamber 41, and is configured to perform a vacuum process in the processing container. For example, the processing modules are configured to include a pre-processing module 5, a first processing module 6, a second processing module 7, and a third processing module 8. In addition, in the modules 2 to 8 of the film forming apparatus 1, a gate valve GV is provided between each of two modules connected to each other.

Next, each of the processing modules 5, 6, 7, 8 will be described.

The pre-processing module 5 is a module that performs pre-processing before forming a Ru film. The pre-processing is a pre-clean process of removing a natural oxide film ($SiO_x$) formed on a wafer surface, and is configured to perform, for example, a chemical oxide removal (COR) process and a post heat treatment (PHT) process. The COR process is a process that degenerates a natural oxide film by using, for example, hydrogen fluoride (HF) gas and ammonia ($NH_3$) gas, and the PHT process is a process that heats a wafer to sublimate and remove a reaction product generated in the COR process.

<First Processing Module>

The first processing module 6 is configured as a module that forms a Ru film for a contact layer by, for example, a chemical vapor deposition (CVD) method. The Ru film for the contact layer is a Ru film formed on the bottom surface of the recess 12 to cover the p-type diffusion layer exposed on the bottom surface of the recess 12, and will here be described as a first Ru film.

Figure 4:
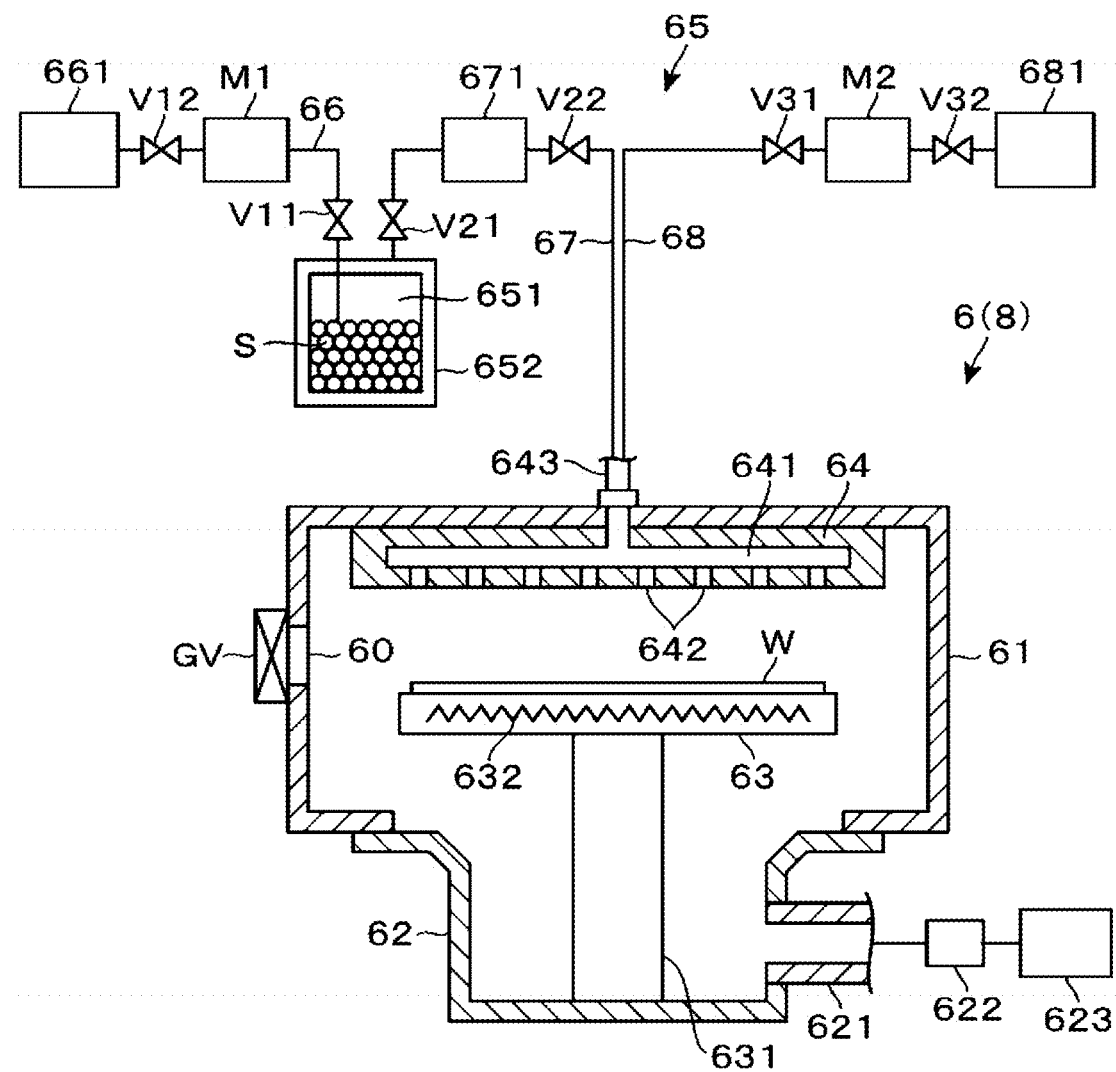
FIG. 4 is a vertical cross-sectional side view illustrating an example of a first processing module provided in the apparatus.

FIG. 4 is a vertical cross-sectional side view illustrating a configuration example of the first processing module 6. The processing module 6 includes a processing container (first processing container) 61, and a lower portion of the processing container 61 is configured as an exhaust chamber 62. The processing container 61 is connected to the vacuum transfer chamber 41 via a transfer port 60 of the wafer W configured to be opened and closed by the gate valve GV, and is configured such that the wafer W is loaded and unloaded by the substrate transfer mechanism 42. The exhaust chamber 62 is connected to a vacuum exhaust mechanism 623 via an exhaust pipe 621 provided with a pressure regulator 622.

In the processing container 61, a susceptor 63 configured to horizontally support the wafer W is provided in a state of being supported by a support column 631 from a bottom surface side thereof. The susceptor 63 includes a heater 632 and is configured to heat the wafer W to a preset temperature, for example, a temperature within a range of 150 degrees C. to 200 degrees C.

A shower head 64 is disposed on a ceiling of the processing container 61 to face the wafer W placed on the susceptor 63. The shower head 64 includes a gas diffusion space 641, and a plurality of gas ejection ports 642 are dispersedly formed in a bottom surface thereof.

The first processing module 6 includes a gas supply mechanism 65 and is configured to supply a gas containing a ruthenium compound to the processing container 61. As the ruthenium compound, for example, $Ru_3(CO)_{12}$ or dicarbonyl-bis(5-methyl-2,4-hexanedionato)ruthenium can be used. In this example, a case where $Ru_3(CO)_{12}$ is used as the ruthenium compound and the gas containing this ruthenium compound contains CO gas will be described.

The gas supply mechanism 65 includes a raw material container 651 that stores a film-forming raw material S, and is configured such that the film-forming raw material S in the raw material container 651 is heated by a heater 652. Solid $Ru_3(CO)_{12}$ is accommodated in the raw material container 651 as the film-forming raw material S.

One end of a carrier gas pipe 66 is provided in the raw material container 651 to be inserted into the film-forming raw material S. The other end of the pipe 66 is connected to a carrier gas (e.g., CO gas) source 661 via a valve V11, a mass flow controller M1, and a valve V12 in order from a downstream side. However, as the carrier gas, an inert gas such as Ar gas or $N_2$ gas may be used instead of the CO gas. An upper end surface of the raw material container 651 and a gas introduction port 643 of the shower head 64 are connected via a gas pipe 67 having a valve V21, a flow meter 671 and a valve V22 in order from a side of the raw material container 651. The raw material container 651, the carrier gas source 661, the carrier gas pipe 66, the gas pipe 67, and the like constitute a first gas supply.

In addition, the gas introduction port 643 of the shower head 64 is connected to a source 681 of a reaction adjustment gas such as CO gas via a gas pipe 68 including a valve V31, a mass flow controller M2, and a valve V32 in order from a downstream side. As the reaction adjustment gas, $N_2$ gas, $H_2$ gas, Ar gas, or the like may be used in addition to the CO gas.

<Second Processing Module>

The second processing module 7 is a module configured to form a ruthenium silicide film containing $Ru_2Si_3$ by supplying a gas containing a silicon compound to the wafer W on which the first Ru film has been formed in the first processing module 6. Here, a process performed by the second processing module 7 will be described as a silicide treatment process (hereinafter, referred to as a "treatment process").

Figure 5:
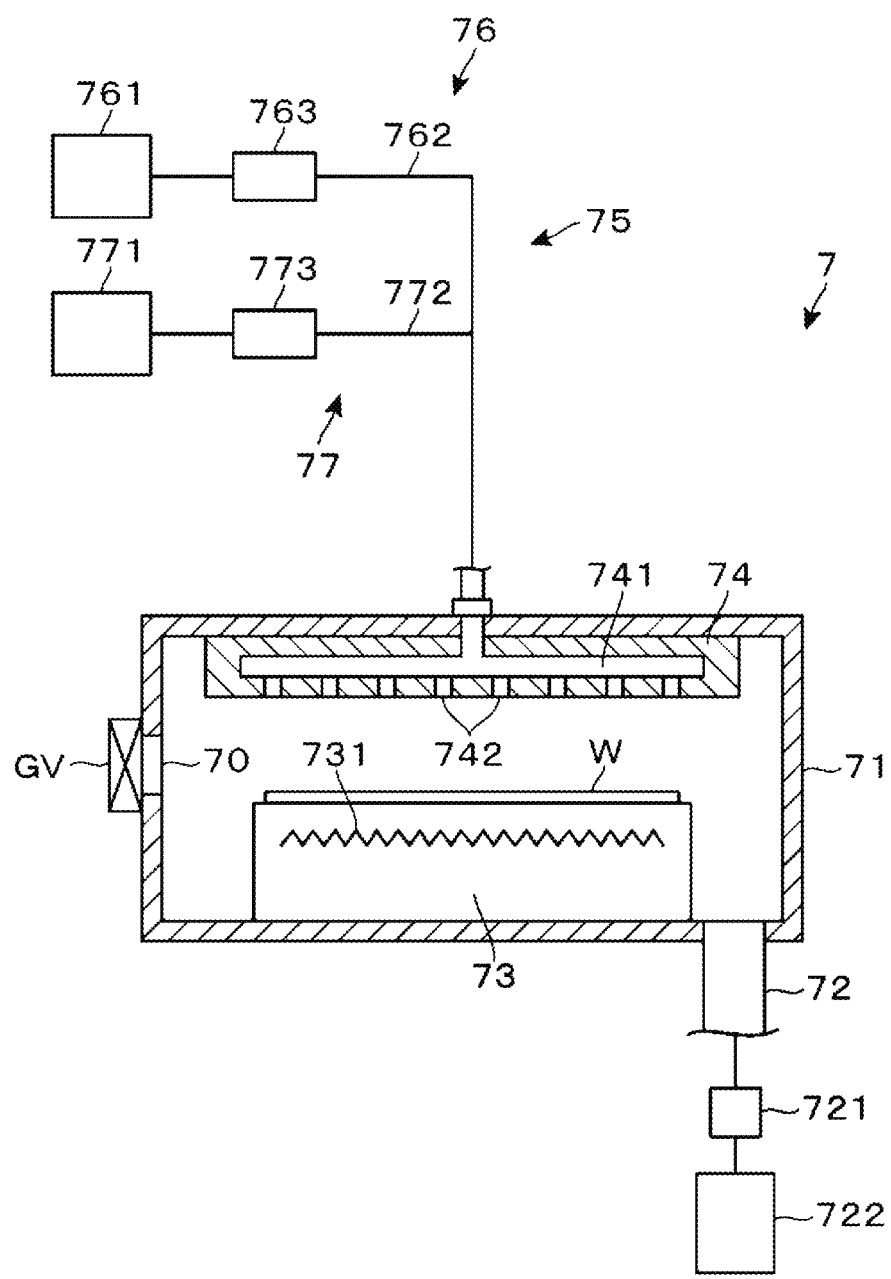
FIG. 5 is a vertical cross-sectional side view illustrating an example of a second processing module provided in the apparatus.

An example of the second processing module 7 will be described with reference to FIG. 5. The processing module 7 includes a processing container (second processing container) 71, and the processing container 71 is connected to a vacuum exhaust mechanism 722 via an exhaust pipe 72 provided with a pressure regulator 721. The processing container 71 is connected to the vacuum transfer chamber 41 via a transfer port 70 of the wafer W configured to be opened and closed by the gate valve GV, and is configured such that the wafer W is loaded and unloaded by the substrate transfer mechanism 42.

A stage 73 on which the wafer W is placed substantially horizontally is disposed inside the processing container 71. The stage 73 is configured, for example, in a substantially circular shape in a plan view, and is configured to include a heater 731 to heat the wafer W placed on the stage 73 to a temperature of 420 degrees C. or higher and lower than 500 degrees C.

A shower head 74 is disposed on a ceiling of the processing container 71 to face the wafer W placed on the stage 73. The shower head 74 includes a gas diffusion space 741, and a plurality of gas ejection ports 742 are dispersedly formed in a bottom surface thereof.

The second processing module 7 includes a gas supply mechanism 75 and is configured to supply a gas containing a silicon compound to the processing container 71. The gas containing the silicon compound in this example contains hydrogen gas ($H_2$ gas) which is a reducing agent, and monosilane gas ($SiH_4$ gas), for example, may be used as the silicon compound.

The gas supply mechanism 75 includes a monosilane gas supply 76 and a hydrogen gas supply 77, and the monosilane gas supply 76 and the hydrogen gas supply 77 constitute a second gas supply.

The monosilane gas supply 76 includes a $SiH_4$ gas source 761 and a pipe 762 in which a supply controller 763 is interposed, and is configured to supply $SiH_4$ gas to the processing container 71. The hydrogen gas supply 77 includes a $H_2$ gas source 771 and a pipe 772 in which a supply controller 773 is interposed, and is configured to supply $H_2$ gas to the processing container 71. Each of the supply controllers 763 and 773 is provided with, for example, a mass flow controller or a valve.

In addition to $SiH_4$, one selected from a silicon compound group consisting of $Si_2H_6$, $Si_2I_6$, $SiI_4$, $SiHI_3$, $SiH_2I_2$, $SiH_3I$, $Si_2Cl_6$, $SiCl_4$, $SiHCl_3$, $SiH_2Cl_2$, $SiH_3Cl$, $Si_2Br_6$, $SiBr_4$, $SiHBr_3$, $SiH_2Br_2$, $SiH_3Br$, $Si_2F_6$, $SiF_4$, $SiHF_3$, $SiH_2F_2$, and $SiH_3F$ may be used as the silicon compound.

In addition, deuterium $\Phi_2$) gas may be used as a gas acting as a reducing gas.

<Third Processing Module>

The third processing module 8 is configured as a module for forming a Ru film for wiring by, for example, a CVD method. The Ru film for wiring is a Ru film embedded in the recess 12 on a top surface side of the ruthenium silicide film, and will here be described as a second Ru film.

The third processing module 8 is configured similarly to the first processing module illustrated in FIG. 4 except that the third processing module 8 is configured to heat the wafer W to a temperature higher than the temperature of forming the first Ru film and lower than 500 degrees C. Accordingly, the third processing module 8 includes a third processing container 61 connected to the vacuum transfer chamber 41, and a third gas supply configured to supply a raw material gas of a metal for wiring such as ruthenium. The raw material gas is, for example, $Ru_3(CO)_{12}$. Like the first gas supply, the third gas supply includes the raw material container 651 holding $Ru_3(CO)_{12}$, the gas source 661 of CO gas as the carrier gas (CO gas), the carrier gas pipe 66, the gas pipe 67, and the like.

<Controller>

The film forming apparatus 1 includes a controller 100 configured to control operations of respective components that constitute the film forming apparatus 1, such as various processes in the processing modules 5, 6, 7, and 8, wafer transfer, and the like. The controller 100 is configured with, for example, a computer including a CPU and a storage (not illustrated). The storage stores a program in which a group of steps (instructions) for control necessary to form the ruthenium silicide film containing $Ru_2Si_3$ and the ruthenium film for embedding, which will be described later, is organized. The program is stored in a non-transient computer readable storage medium such as a hard disk, a compact disk, a magneto-optical disk, a memory card, a nonvolatile memory, or the like, from which the program is installed in the computer.

First Embodiment

Next, a first embodiment of a method of forming a ruthenium silicide film on a wafer surface will be described together with operations of the film forming apparatus 1 with reference to FIGS. 6A to 7B.

Figure 6A:
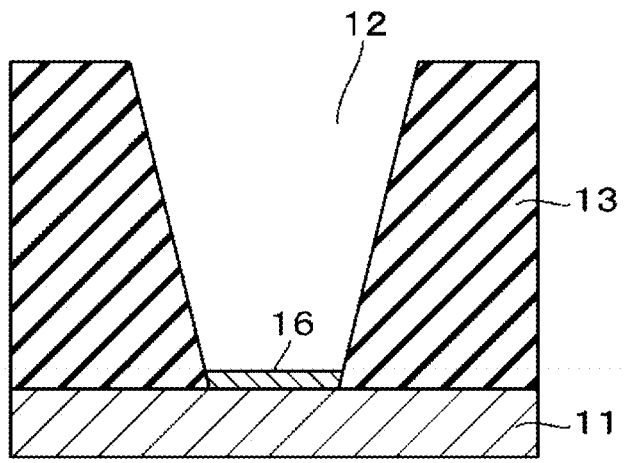
FIGS. 6A to 6C are first explanatory views illustrating contents of wafer processing according to a first embodiment.

First, the carrier 20 accommodating the wafer W is transferred to the film forming apparatus 1. In the carrier 20, a plurality of wafers W is accommodated, wherein in each of the wafers W, the insulating film 13 formed of SiN is formed on the surface of the silicon substrate 11 where the p-type diffusion layer is exposed and the recess 12 has been formed by etching. As illustrated in FIG. 6A, in each of the wafers W, a natural oxide film 16 is formed on a surface of the silicon substrate 11 exposed at a bottom portion of the recess 12 (the bottom surface of the recess 12).

Figure 6B:
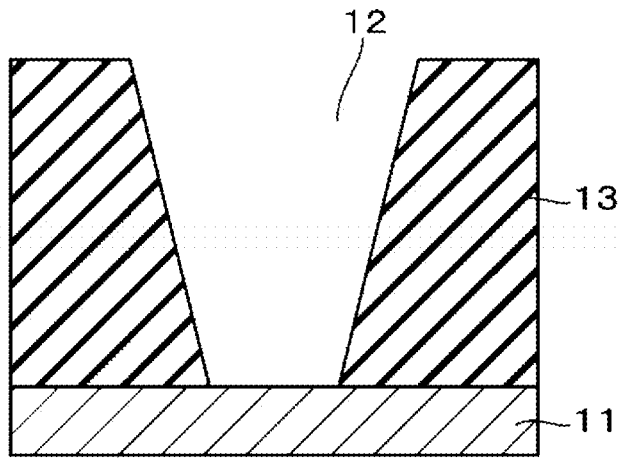

In the film forming apparatus 1, the wafer W accommodated in the carrier 20 is taken out by the atmospheric transfer mechanism 22, and positioned by the orienter 24. Thereafter, the wafer W is loaded into the load-lock module 31 having an atmospheric pressure atmosphere, and the load-lock module 31 is adjusted to a vacuum atmosphere. Subsequently, the wafer W in the load-lock module 31 is transferred to the pre-processing module 5 by the substrate transfer mechanism 42, and the pre-cleaning process described above is performed to remove the natural oxide film 16 formed on the bottom surface of the recess 12, as illustrated in FIG. 6B. As a result, the p-type diffusion layer is exposed on the bottom surface of the recess 12.

<Formation of First Ru Film>

Subsequently, the substrate transfer mechanism 42 transfers the wafer W to the first processing module 6. In the first processing module 6, a ruthenium film (first Ru film) is formed on the bottom surface of the recess 12 to cover the p-type diffusion layer (see FIG. 6C).

Specifically, the wafer W is loaded into the first processing container 61, placed on the susceptor 63, and heated to, for example, 130 degrees C. to 180 degrees C., and a pressure inside the processing container 61 is regulated to, for example, 2.2 Pa. At this time, $Ru_3(CO)_{12}$ is heated by the heater 652 in the raw material container 651. By supplying CO gas as a carrier gas to the raw material container 651, $Ru_3(CO)_{12}$ vaporized by the heating is picked up and supplied to the processing container 61 as a ruthenium raw material. Furthermore, CO gas for reaction adjustment is supplied to the processing container 61.

As a result, the vaporized $Ru_3(CO)_{12}$ is supplied to the wafer W, and thermal CVD that thermally decomposes the $Ru_3(CO)_{12}$ progresses on the wafer W to form a first Ru film 17 on the bottom surface of the recess 12. The first Ru film 17 is formed to have a preset thickness, for example, 10 nm or less, in some embodiments, 4 nm to 5 nm. The CO gas for reaction adjustment is supplied to suppress excessive progress of the thermal decomposition.

The bottom surface of the recess 12 is composed of the silicon substrate 11, and a side wall of the recess 12 is composed of the insulating film (SiN film) 13. A film formation rate of the first Ru film on the silicon substrate 11 differs from that on the insulating film 13. Here, the first Ru film 17 is formed under a condition that the film formation rate is higher on a side of the bottom surface of the recess 12 than on a side of the side wall thereof. This condition may be implemented by adjusting the above-described wafer heating temperature, the pressure in the processing container 61, a supply ratio of the ruthenium raw material and the reaction adjustment gas, and the like, and may be specified through a preliminary experiment or the like.

Figure 6C:
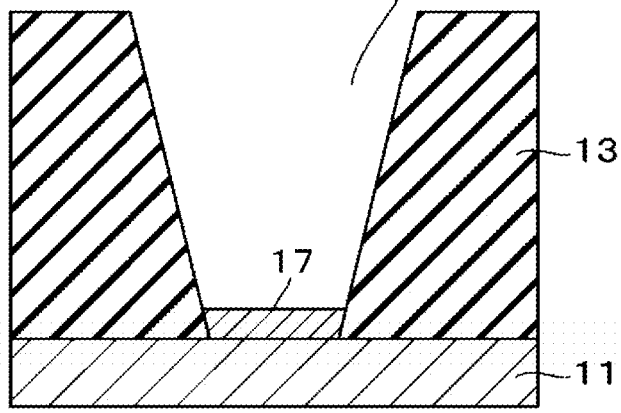
Figure 7A:
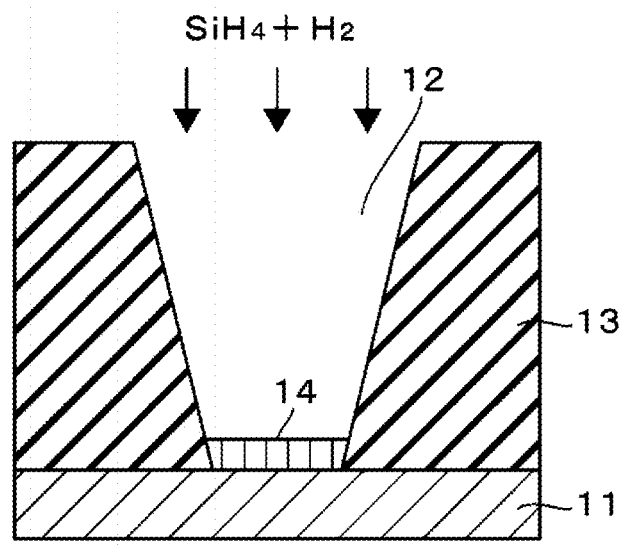
FIGS. 7A and 7B are second explanatory views illustrating the contents of wafer processing.
Figure 7A:
Figure 7B:
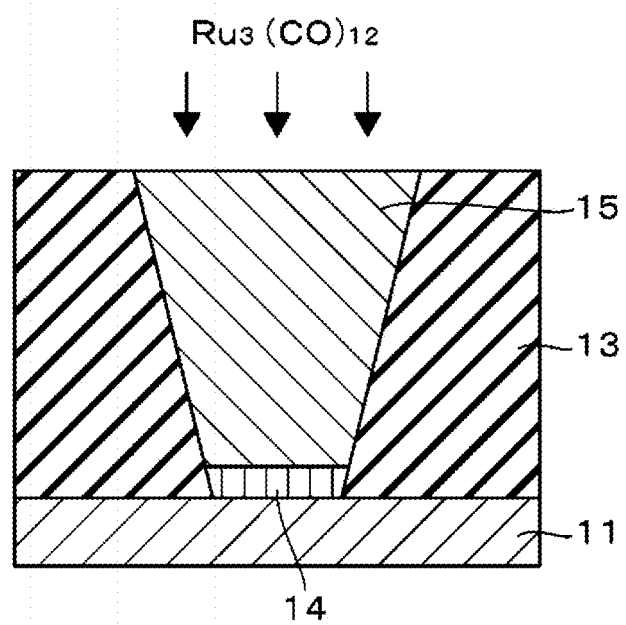

Since a thickness of the Ru film formed under this condition is as small as 4 nm to 5 nm, almost no Ru film is formed on the surface of the insulating film 13, and the first Ru film 17 is selectively formed on the bottom surface of the recess 12 as illustrated in FIG. 6C. The inventor also found that under the film formation temperature of 130 degrees C. to 180 degrees C., almost no Ru film is deposited on a surface of the exposed SiN film.

<Formation of Ruthenium Silicide Film>

Subsequently, the wafer W having the first Ru film 17 formed thereon is transferred from the first processing module 6 to the second processing container 71 of the second processing module 7 by the substrate transfer mechanism 42. In this second processing module 7, a process of forming a ruthenium silicide film containing $Ru_2Si_3$ on a top surface of the first Ru film 17 is performed.

Specifically, the wafer W is loaded into the second processing container 71, placed on the stage 73, and heated to a temperature within a range of 420 degrees C. or higher and lower than 500 degrees C., and a pressure inside the processing container 71 is regulated to, for example, 400 Pa (3 Torr). Then, $SiH_4$ gas as the gas containing the silicon compound and $H_2$ gas are supplied into the processing container 71 (see FIG. 7A).

When the gases are supplied to the first Ru film 17, the first Ru film 17 is reduced by the $SiH_4$ gas and the $H_2$ gas, and silicon (Si) is incorporated into the first Ru film 17. Since the wafer W is heated to the temperature within the range of 420 degrees C. or higher and lower than 500 degrees C., in the first Ru film 17, new bonds between Si and Ru are formed and thus $Ru_2Si_3$, which is a semiconductor, is formed, as is clear from the evaluation experiments described later. It has been confirmed by the evaluation experiments that this $Ru_2Si_3$ contains an orthorhombic crystal structure.

As described above, a ruthenium silicide film containing $Ru_2Si_3$ is formed as the contact layer 14 (hereinafter, also referred to as a "ruthenium silicide film 14" to cover the p-type diffusion layer exposed on the bottom surface of the recess 12. The ruthenium silicide film containing $Ru_2Si_3$ may contain RuSi having a composition other than $Ru_2Si_3$.

In this embodiment, since a film thickness of the first Ru film 17 is 10 nm or less, the first Ru film 17 is entirely silicided by supplying the gas containing the silicon compound to the first Ru film 17, so that a ruthenium silicide film is formed.

<Formation of Second Ru Film>

Subsequently, the wafer W is transferred from the second processing module 7 to the third processing container 61 of the third processing module 8 by the substrate transfer mechanism 42. Then, in the processing module 8, a process of forming a ruthenium film (metal film) for wiring in the recess 12 on a top surface side of the ruthenium silicide film 14 is performed (see FIG. 7B).

Specifically, the wafer W having the above-described ruthenium silicide film 14 formed thereon is loaded into the third processing container 61 and placed on the susceptor 63. Then, the wafer W is heated to a temperature higher than the film formation temperature of the first Ru film 17, for example, 180 degrees C. to 250 degrees C., and the pressure inside the processing container 61 is regulated to, for example, 2.2 Pa. As described above, like the first Ru film 17, for example, $Ru_3(CO)_{12}$ gas and CO gas are supplied as gases containing a ruthenium compound, and a second Ru film is formed by thermal CVD.

In the recess 12, the ruthenium silicide film 14 is formed on the bottom and the insulating film 13 is formed on the side wall. In the third processing module 8, film formation is performed in a temperature range higher than that of the first Ru film 17. Therefore, a precipitation speed of Ru from the $Ru_3(CO)_{12}$ is high, and thus the second Ru film is deposited not only on the bottom surface of the recess 12, but also on a portion in contact with the side wall. Thus, the formation of the second Ru film progresses rapidly to fill the recess 12, forming the wiring layer 15.

In this process as well, since a processing temperature of the film forming process is set to a temperature of lower than 500 degrees C., it is possible to suppress a thermal effect even when the wafer W is for forming a field effect transistor for a logic element including a p-type diffusion layer.

After the film forming process is terminated, the wafer W in the third processing module 8 is transferred to the load-lock module 32 by the substrate transfer mechanism 42. Subsequently, after the atmosphere in the load-lock module 32 is switched to the atmospheric pressure atmosphere, the atmospheric transfer mechanism 22 returns the processed wafer W to the carrier 20.

According to the above-described embodiment, it is possible to form a ruthenium silicide film containing $Ru_2Si_3$ at a temperature of lower than 500 degrees C.

In this example, after forming the ruthenium film (the first Ru film), $Ru_2Si_3$ is formed by supplying the gas containing the silicon compound to the wafer W while heating the wafer W to the temperature within the range of 420 degrees C. or higher and lower than 500 degrees C. For this reason, compared with the method of forming $Ru_2Si_3$ by thermal diffusion by heating a wafer W having a Ru film formed thereon, it is possible to form a ruthenium silicide film containing orthorhombic $Ru_2Si_3$ at a lower temperature, as is clear from the evaluation experiments described later.

$Ru_2Si_3$ is a low-resistance material having a low Schottky barrier for a p-type silicon substrate. In addition, since it is possible to form a ruthenium silicide film containing $Ru_2Si_3$ at a temperature of lower than 500 degrees C., $Ru_2Si_3$ may be used for a silicon substrate on which a field effect transistor for a logic element including a p-type diffusion layer is formed. In particular, it is possible to suppress the contact resistance to be low by using a ruthenium silicide film containing $Ru_2Si_3$ as a contact layer formed to cover the p-type diffusion layer.

In Patent Documents 1 and 2, there is no description suggesting the features of the present disclosure, such as the result of searching for a low-resistance material for a silicon substrate having an exposed p-type diffusion layer, or a ruthenium silicide film containing $Ru_2Si_3$, which is a semiconductor.

In the above-described film forming apparatus 1, removing the native oxide film in the recess 12, forming the first Ru film 17 for the contact layer, and forming the ruthenium silicide film 14 are performed in the same film forming apparatus 1. Between the first and second processing modules 6 and 7 that perform these processes, the wafer W is transferred by the substrate transfer mechanism 42 via the common vacuum transfer chamber 41. Thus, there is almost no possibility that oxygen will come into contact with the wafer W during the transfer. Therefore, it is possible to form the ruthenium silicide film 14 having a low oxygen impurity content, and to form a film having a lower resistance.

In addition to the first and second processing modules 6 and 7, the film forming apparatus 1 is provided with the third processing module 8 for forming a second Ru film for wiring. As a result, it is possible to suppress the oxygen impurity content to be low not only in the ruthenium silicide film 14 but also in the wiring layer 15 made of the second Ru film. In addition, since it is possible to perform a series of processes of forming the first Ru film 17, forming the ruthenium silicide film 14, and forming the second Ru film in the same film forming apparatus 1, it does not require or take time for transfer between individual processing modules, shortening a total processing time.

Second Embodiment

Next, a second embodiment of the present disclosure will be described. The second embodiment differs from the first embodiment in the processing conditions in the second processing module 7. Therefore, the processes from FIG. 6A to FIG. 6C are performed in a similar to those in the first embodiment. That is, after the first Ru film 17 is formed on the wafer W, from which the natural oxide film has been removed in the pre-processing module 5, in the first processing module 6 to cover the p-type diffusion layer, the wafer W is transferred to the second processing module 7.

In the second processing module 7, a gas containing a manganese compound as an additive for adjusting a band gap of $Ru_2Si_3$ is used as the gas containing the silicon compound. As the manganese compound, for example, $Mn_2(CO)_{10}$ may be used. Such an additive may be supplied at a flow rate of, for example, about 10% of a flow rate of the gas containing the silicon compound. A titanium compound, an antimony compound, or a platinum compound may be used as an additive, instead of the manganese compound or together with the manganese compound.

After forming the ruthenium silicide film 14 as described above, the wafer W is transferred to the third processing module 8. Then, in the third processing container 61, a process of embedding the second Ru film in the recess 12 is performed by the same method as in the first embodiment.

In this embodiment as well, it is possible to form a ruthenium silicide film at a temperature of lower than 500 degrees C. In addition, when the gas containing the manganese compound is supplied as the additive, $Ru_2Si_3$, which is a semiconductor, is doped with a metal as impurities. Thus, it is possible to reduce the band gap and to lower a resistance of the ruthenium silicide film 14.

Examples

Next, a preliminary experiment by a conventional method and evaluation experiments by the method of the present disclosure, which were conducted to evaluate the methods of forming $Ru_2Si_3$, will be described.

<Preliminary Experiment>

By changing a temperature, samples in each of which a Ru film was formed on a surface of a silicon substrate were heated to form ruthenium silicide films by thermal diffusion of silicon into the Ru films, and crystal structures of the ruthenium silicide films were analyzed by X-ray diffraction (XRD).

The formation of the Ru films was performed in the first processing module 6 by using $Ru_3(CO)_{12}$ and CO gas under conditions of 130 degrees C. to 180 degrees C. and 2.2 Pa as described above, thereby forming the Ru films on the flat surfaces of silicon substrates. A thickness of the Ru films was set to be 20 nm. In addition, the heating was performed in the second processing module 7 by supplying $N_2$ gas as an annealing gas without supplying $SiH_4$ gas and $H_2$ gas into the processing container 71 and heating the silicon substrates by the heater of the stage 73. The temperatures at this time were 450 degrees C., 500 degrees C., 550 degrees C., 600 degrees C., and 700 degrees C.

Figure 8:
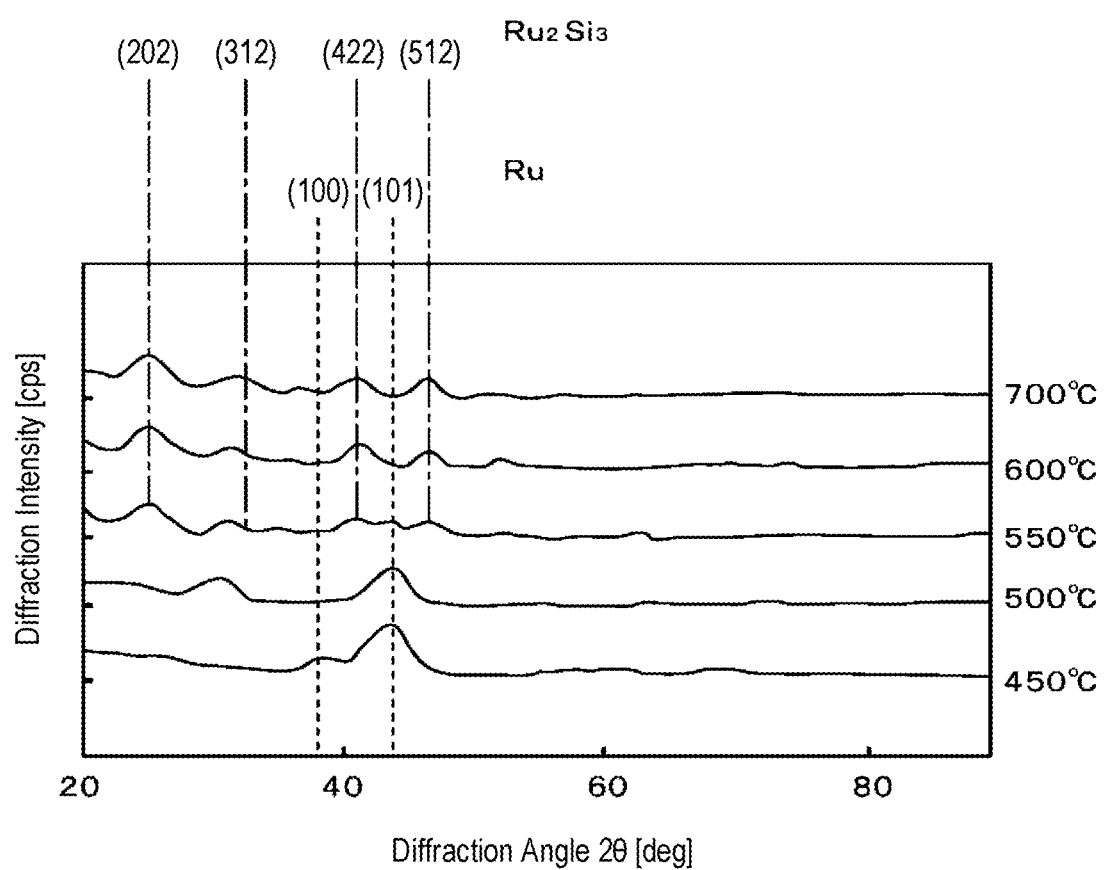
FIG. 8 is a characteristic diagram showing results of a preliminary experiment.

FIG. 8 shows results of XRD analysis for the respective Ru films after the heating. In FIG. 8, the horizontal axis represents a diffraction angle, the left-hand side vertical axis represents a diffraction intensity, and the right-hand side vertical axis represents a temperature. In addition, in FIG. 8, the tetragonal Miller indices of $Ru_2Si_3$ (202), (312), (422), and (512) and the hexagonal Miller indices of Ru (100) and (101) are indicated together.

As a result, it has been recognized that a peak position of an XRD spectrum differs between the cases where the heating temperatures were 450 degrees C. and 500 degrees C., respectively, and the cases where the heating temperatures were 550 degrees C., 600 degrees C., and 700 degrees C., respectively. In addition, from a ratio of the peak position and a peak intensity, it has been recognized that the Ru films contain tetragonal $Ru_2Si_3$ at the heating temperatures of 550 degrees C., 600 degrees C., and 700 degrees C. On the other hand, at the heating temperatures of 450 degrees C. and 500 degrees C., only hexagonal Ru was contained in the Ru films, and formation of $Ru_2Si_3$ could not be confirmed.

As described above, it has been confirmed that it is difficult to form $Ru_2Si_3$ by the conventional silicidation method using thermal diffusion unless heating is performed at a temperature of 550 degrees C. or higher.

<Evaluation Experiment 1>

Next, an evaluation experiment of the method of forming $Ru_2Si_3$ according to the present disclosure will be described. In this evaluation experiment, samples in each of which a 114 nm-thick Ru film was formed on a top surface of a $SiO_2$ film were used, and $SiH_4$ gas and $H_2$ gas were supplied to the samples to perform a treatment process. Then, a temperature dependency of the process was evaluated. The reason why the Ru film is formed on the top surface of the $SiO_2$ film is to suppress silicon from diffusing from the $SiO_2$ film to the Ru film.

The first Ru film was formed in the first processing module 6 by using $Ru_3(CO)_{12}$ and CO gases under the conditions of 130 degrees C. to 180 degrees C. and 2.2 Pa as described above.

In addition, the treatment process was performed in the second processing module 7 under conditions of $SiH_4$ of 500 sccm, $H_2$ of 500 sccm, $N_2$ of 6000 sccm, a pressure of 400 Pa (3 Torr), and a process time of 600 seconds. The temperatures at this time were 450 degrees C. in Example 1 and 500 degrees C. in Reference Example.

The crystal structures of the samples after the treatment process were analyzed by XRD.

In addition, as comparative examples, the same analysis was performed for the case where only $H_2$ gas was supplied. Comparative examples were performed under the same conditions as in Example 1 except that no $SiH_4$ gas was supplied, and the temperature was 350 degrees C. in Comparative Example 1 and 400 degrees C. in Comparative Example 2.

Figure 9:
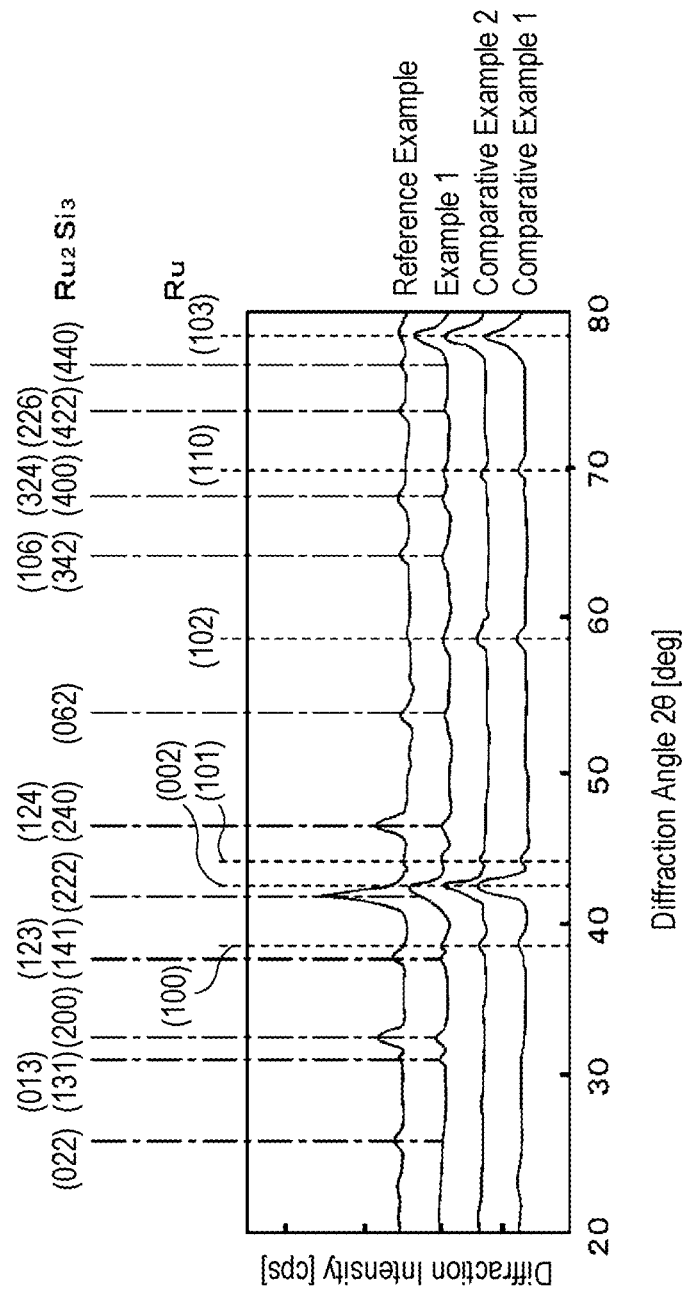
FIG. 9 is a characteristic diagram showing results of Evaluation Experiment 1.

FIG. 9 shows the XRD analysis results. In FIG. 9, the horizontal axis represents a diffraction angle, and the left-hand side vertical axis represents a diffraction intensity. In FIG. 9, the orthorhombic Miller indices of $Ru_2Si_3$ (022), (131)(013), (200), (141)(123), (222), (240)(124), (062), (342)(106), (400)(324), (422)(226), and (440) are indicated. The hexagonal Miller indices of Ru (100), (002), (101), (102), (110), and (103) are also indicated.

As a result, it has been recognized that the Ru films of Comparative Example 1 (350 degrees C.) and Comparative Example 2 (400 degrees C.) only contained hexagonal Ru. Therefore, it is estimated that, even when $SiH_4$ gas is supplied for the treatment process, Ru is unlikely to be silicided when the heating temperature is 400 degrees C. or lower.

On the other hand, it has been recognized that peaks that are not present in Comparative Examples 1 and 2 appear in Example 1 (450 degrees C.). Moreover, it has been confirmed that peak positions in Reference Example (500 degrees C.) differ from those in Comparative Examples 1 and 2, and high peak intensities appear in Example 1. In addition, although not shown, it has been recognized that the peak intensities are even higher in data obtained when the temperature was 550 degrees C.

The peaks appearing in Example 1 indicate that orthorhombic $Ru_2Si_3$ was formed. From this evaluation experiment, it has been confirmed that silicidation of Ru progresses and $Ru_2Si_3$ is formed when the temperature of the treatment process is 450 degrees or higher. However, since film thicknesses of the ruthenium films in the samples were 114 nm, which is significantly larger than the first Ru film having the film thickness of 10 nm or less, it is estimated that silicidation progresses at a temperature lower than 450 degrees C. for the first Ru film having a smaller thickness. In addition, it is considered that it is possible to form $Ru_2Si_3$ at a lower temperature by using the gas containing the silicon compound having a larger reducing power than $SiH_4$ gas and $H_2$ gas. Based on these facts, it can be said that silicidation of the first Ru film progresses at a temperature within a range of higher than 400 degrees C. and 450 degrees C. or lower (e.g., at a temperature 420 degrees C. or higher) to form $Ru_2Si_3$.

<Evaluation Experiment 2>

Subsequently, by using the same samples as in Evaluation Experiment 1, the temperature was changed in the range of 350 degrees C. to 550 degrees C., and the treatment process was performed by using $SiH_4$ gas and $H_2$ gas to evaluate temperature dependency of the treatment process. Condition other than the temperatures in the formation of the first Ru film and treatment process were the same as those in Evaluation Experiment 1.

With respect to the samples (example) after the treatment process, Si contents in the obtained films were measured by energy dispersive X-ray spectroscopy (EDX), and surface conditions of the films were observed with a scanning electron microscope (SEM).

In addition, as a reference example, evaluation was also made on a case where the same process was performed by supplying H$_2$ gas only, i.e., without using SiH$_4$ gas. Processing conditions of the reference example were the same as those of the example except that SiH$_4$ gas was not added.

Figure 10:
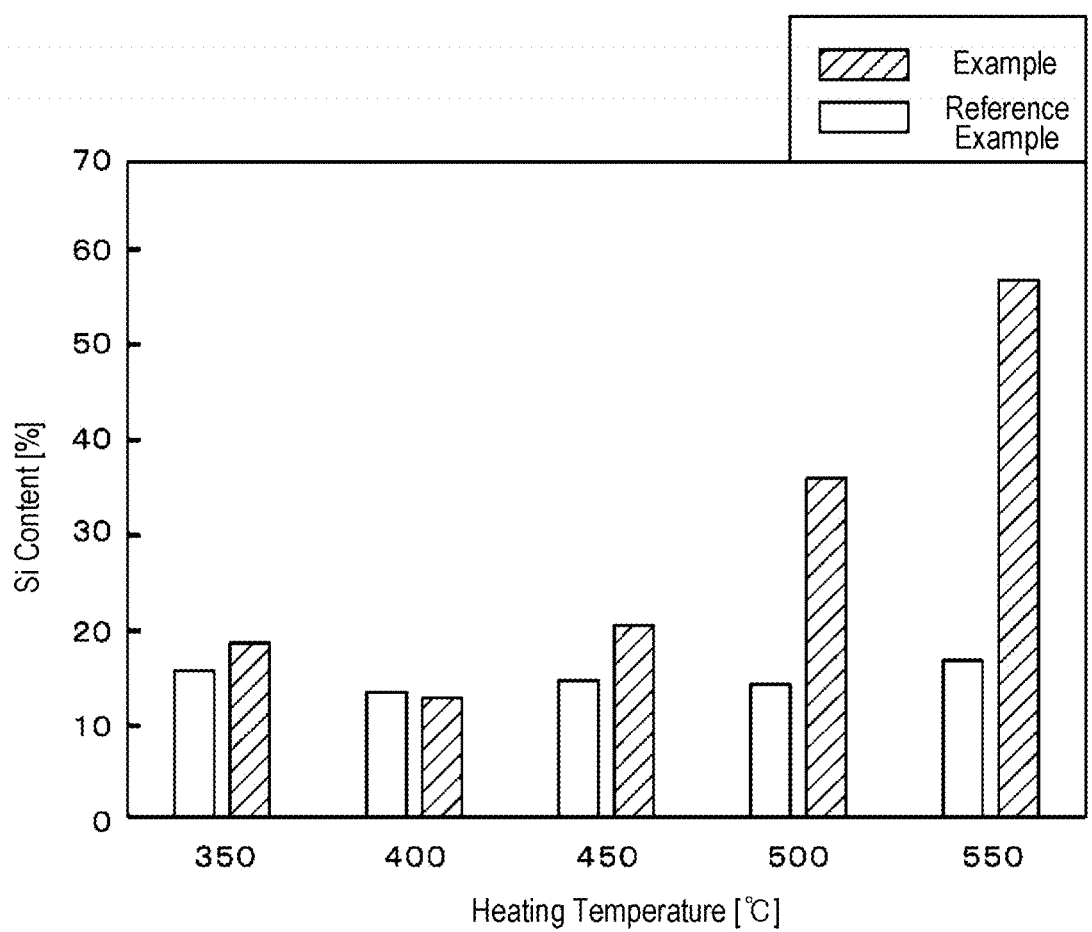
FIG. 10 is a characteristic diagram showing results of Evaluation Experiment 2.

FIG. 10 shows the EDX measurement results. The horizontal axis represents a heating temperature of the treatment process, and the vertical axis represents a Si content. In FIG. 10, the hatched bar graphs represent the example, and the white bar graphs represent the reference example. As a result, in the reference example, it is confirmed that the Si contents in the films are almost constant regardless of the temperature. In the example, it has been confirmed that at 450 degrees C., the Si content in the film increases compared to the reference example, and at temperatures above 450 degrees C., the Si content also increases as the temperature increases. As described above, it has been confirmed that at a temperature of 450 degrees C. or higher, the Si content in the film increases by the supply of SiH$_4$ gas, and silicon is incorporated into the film.

Figure 11A:
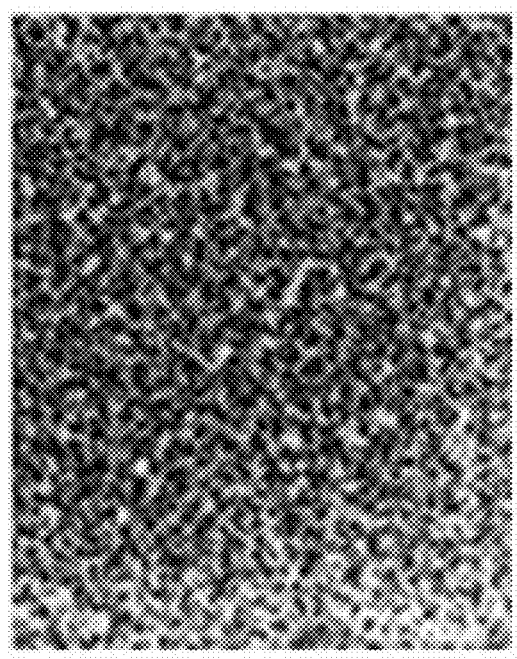
FIGS. 11A and 11B illustrate SEM images showing states of surfaces of ruthenium films processed in Evaluation Test 2.
Figure 11B:
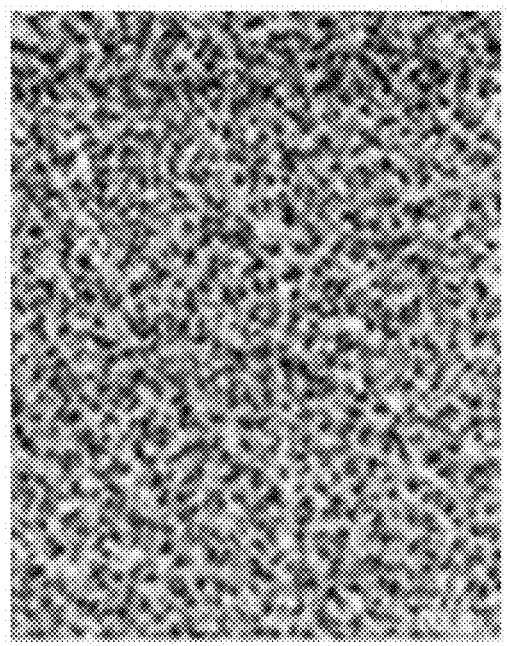

FIG. 11A illustrates an SEM image of the example subjected to the treatment process at 450 degrees C., and FIG. 11B illustrates an SEM image of the reference example subjected to the process at 450 degrees C. From these images, it was confirmed that no abnormal growth of Ru$_2$Si$_3$ was observed even when the treatment by SiH$_4$ was performed. The abnormal growth is an occurrence of abnormal silicidation in which silicidation partially progresses and lumps of Ru$_2$Si$_3$ are formed. Therefore, it is estimated that, by supplying SiH$_4$ gas to the Ru film and performing the treatment process, silicidation proceeds uniformly over the entire in-plane area from a surface side of the Ru film.

As described above, as a result of Evaluation Experiment 1 and Evaluation Experiment 2, it has been confirmed that at a temperature lower than 500 degrees C., silicon is incorporated into a Ru film to form Ru$_2$Si$_3$ having an orthorhombic crystal structure by supplying a gas containing a silicon compound.

In addition, as a result of the preliminary experiment, it has been recognized that Ru$_2$Si$_3$ including a tetragonal crystal structure is formed at a temperature of 550 degrees or higher in the conventional heating process of a Ru film. From this, it can be said that, even in the silicidation by supplying the gas containing the silicon compound according to the present disclosure, Ru$_2$Si$_3$ containing a tetragonal crystal structure may be formed according to a type of the gas containing a silicon compound and processing conditions such as a pressure in a processing container.

In the above, the apparatus for forming a ruthenium silicide film on a surface of a substrate is not limited to the configuration of the film forming apparatus 1 illustrated in FIG. 1. For example, in the first processing module, a ruthenium film for a contact layer and a ruthenium film for embedding may be formed by changing a film formation temperature. The ruthenium film for a contact layer and the ruthenium film for embedding may be different from each other in the type of the gas containing the ruthenium compound. In addition, the metal for wiring is not limited to ruthenium.

Furthermore, the ruthenium silicide film is not limited to being formed as a contact layer as long as the ruthenium silicide film is formed to cover a diffusion layer on a surface of a substrate where the diffusion layer is exposed.

The present disclosure is applicable not only to a silicon substrate, but also to a silicon germanium substrate (a SiGe substrate) or a germanium substrate (a Ge substrate). Moreover, in the SiGe substrate and the Ge substrate, a ruthenium silicide film containing Ru$_2$Si$_3$ may be formed to cover not only a p-type diffusion layer, but also an n-type diffusion layer. Even in such cases, it is considered that it is possible to form a low-resistance ruthenium silicide film.

According to the present disclosure, it is possible to form a ruthenium silicide film including Ru$_2$Si$_3$ on a surface of a substrate at a temperature of lower than 500 degrees C.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a ruthenium silicide film on a surface of a substrate, the method comprising:
    forming a ruthenium film to cover a diffusion layer by supplying a gas containing a ruthenium compound to the surface of the substrate where the diffusion layer is exposed; and
    forming the ruthenium silicide film including Ru$_2$Si$_3$ by siliciding the ruthenium film by supplying a gas containing a silicon compound to the substrate while heating the substrate to a temperature within a range of 420 degrees C. or higher and lower than 500 degrees C.

2. The method of claim 1, wherein the substrate is a silicon substrate including a p-type diffusion layer.

3. The method of claim 2, wherein, on the silicon substrate, a field effect transistor for a logic element including the p-type diffusion layer is formed.

4. The method of claim 1, wherein the ruthenium silicide film includes orthorhombic or tetragonal Ru$_2$Si$_3$.

5. The method of claim 1, wherein the silicon compound includes one selected from a silicon compound group consisting of SiH$_4$, Si$_2$H$_6$, Si$_2$I$_6$, SiI$_4$, SiHI$_3$, SiH$_2$I$_2$, SiH$_3$I, Si$_2$Cl$_6$, SiCl$_4$, SiHCl$_3$, SiH$_2$Cl$_2$, SiH$_3$Cl, Si$_2$Br$_6$, SiBr$_4$, SiHBr$_3$, SiH$_2$Br$_2$, SiH$_3$Br, Si$_2$F$_6$, SiF$_4$, SiHF$_3$, SiH$_2$F$_2$, and SiH$_3$F.

6. The method of claim 1, wherein the gas containing the silicon compound includes hydrogen gas or deuterium gas as a reducing agent.

7. The method of claim 1, wherein the gas containing the silicon compound contains at least one selected from the group consisting of a manganese compound, a titanium compound, or an antimony compound as an additive for adjusting a band gap of Ru$_2$Si$_3$.

8. The method of claim 1, wherein the ruthenium compound is Ru$_3$(CO)$_{12}$ or dicarbonyl-bis (5-methyl-2,4-hexanedionato) ruthenium, and the gas containing the ruthenium compound includes CO gas.

9. The method of claim 1, wherein the diffusion layer on the surface of the substrate is exposed on a bottom surface of a recess formed in an insulating film that covers a top surface of the substrate, and in the forming the ruthenium film, the ruthenium film is formed on a side of a bottom portion of the recess.

10. The method of claim 9, further comprising, forming a metal film, subsequent to the forming the ruthenium silicide film, to embed a metal for wiring in the recess on a side of a top surface of the ruthenium silicide film, by supplying a raw material gas of the metal to the substrate.

11. The method of claim 10, wherein the metal for wiring is ruthenium.

12. An apparatus for forming a ruthenium silicide film on a surface of a substrate, the apparatus comprising:
- a first processing module including a first processing container configured to accommodate the substrate on which a diffusion layer is exposed and a first gas supply configured to supply a gas containing a ruthenium compound to the first processing container;
- a second processing container configured to accommodate the substrate processed by the first processing module;
- a second processing module including a heater configured to heat the substrate accommodated in the second processing container and a second gas supply configured to supply a gas containing a silicon compound to the second processing container;
- a vacuum transfer module including a substrate transfer mechanism configured to transfer the substrate to a common vacuum transfer chamber to which the first processing container and the second processing container are connected; and
- a controller,
- wherein the controller is configured to output control signals to execute:
  - forming a ruthenium film to cover the diffusion layer by supplying the gas containing the ruthenium compound from the first gas supply to the surface of the substrate in the first processing container;
  - transferring the substrate on which the ruthenium film is formed from the first processing container to the second processing container by the substrate transfer mechanism; and
  - subsequently, forming the ruthenium silicide film including $Ru_2Si_3$ by siliciding the ruthenium film by supplying the gas containing the silicon compound from the second gas supply to the substrate while heating the substrate to a temperature within a range of 420 degrees C. or higher and lower than 500 degrees C. by the heater.

13. The apparatus of claim 12, wherein the substrate is a silicon substrate including a p-type diffusion layer.

14. The apparatus of claim 13, wherein, on the silicon substrate, a field effect transistor for a logic element including the p-type diffusion layer is formed.

15. The apparatus of claim 12, wherein the ruthenium silicide film includes orthorhombic or tetragonal $Ru_2Si_3$.

16. The apparatus of claim 12, wherein the silicon compound includes one selected from a silicon compound group consisting of $SiH_4$, $Si_2H_6$, $Si_2I_6$, $SiI_4$, $SiHI_3$, $SiH_2I_2$, $SiH_3I$, $Si_2Cl_6$, $SiCl_4$, $SiHCl_3$, $SiH_2Cl_2$, $SiH_3Cl$, $Si_2Br_6$, $SiBr_4$, $SiHBr_3$, $SiH_2Br_2$, $SiH_3Br$, $Si_2F_6$, $SiF_4$, $SiHF_3$, $SiH_2F_2$, and $SiH_3F$.

17. The apparatus of claim 12, wherein the gas containing the silicon compound includes hydrogen gas or deuterium gas as a reducing agent.

18. The apparatus of claim 12, wherein the ruthenium compound is $Ru_3(CO)_{12}$ or dicarbonyl-bis(5-methyl-2,4-hexanedionato)ruthenium, and the gas containing the ruthenium compound includes CO gas.

19. The apparatus of claim 12, wherein the diffusion layer on the surface of the substrate is exposed on a bottom surface of a recess formed in an insulating film that covers a top surface of the substrate, and in the forming the ruthenium film, the ruthenium film is formed on a side of a bottom portion of the recess.

20. The apparatus of claim 19, further comprising a third processing module including: a third processing container connected to the vacuum transfer chamber and configured to accommodate the substrate on which the ruthenium silicide film is formed; and a third gas supply configured to supply a raw material gas of a metal for wiring to the third processing container,
- wherein the controller is further configured to output control signals to execute:
  - transferring the substrate on which the ruthenium silicide film is formed from the second processing container to the third processing container by the substrate transfer mechanism; and
  - subsequently, forming a metal film to embed the metal for wiring in the recess on a side of a top surface of the ruthenium silicide film by supplying the raw material gas from the third gas supply to the substrate.

* * * * *